United States Patent
Furodet

(10) Patent No.: US 8,572,468 B2
(45) Date of Patent: Oct. 29, 2013

(54) METHOD FOR TRANSMITTING A BINARY INFORMATION WORD

(75) Inventor: David Furodet, Pontcharra (FR)

(73) Assignee: STMicroelectronics SA, Montrouge (FR)

( * ) Notice: Subject to any disclaimer, the term of this patent is extended or adjusted under 35 U.S.C. 154(b) by 467 days.

(21) Appl. No.: 12/754,845

(22) Filed: Apr. 6, 2010

(65) Prior Publication Data

US 2011/0010605 A1 Jan. 13, 2011

(30) Foreign Application Priority Data

Apr. 6, 2009 (FR) ........................... 09-52238

(51) Int. Cl.
*H03M 13/00* (2006.01)
(52) U.S. Cl.
USPC .......................................... 714/781
(58) Field of Classification Search
USPC .......................................... 714/781
See application file for complete search history.

(56) References Cited

U.S. PATENT DOCUMENTS

| 4,979,174 A | 12/1990 | Cheng et al. ............ 371/41 |
| 5,539,755 A | 7/1996 | Baggen .................... 371/37.1 |
| 6,085,349 A * | 7/2000 | Stein ........................ 714/778 |

FOREIGN PATENT DOCUMENTS

EP     0571019     5/1993

* cited by examiner

*Primary Examiner* — Amine Riad
(74) *Attorney, Agent, or Firm* — Allen, Dyer, Doppelt, Milbrath & Gilchrist, P.A.

(57) ABSTRACT

A method is for transmitting a binary information word (MI) coded on r bits to which is attached a redundancy (CRC) coded on s bits, s and r being integers. The redundancy (CRC) signals the appearance of erroneous bits after the transmission, and is obtained by carrying out a Euclidian division of the information word (MI) to be transmitted by a generator polynomial coded on at most s bits. The generator polynomial is chosen so that it satisfies at least one of the following conditions, namely that the Hamming weight of the multiples of the generator polynomial is greater than or equal to a chosen threshold, or the generator polynomial allows the detection of at least $2^{s-1}-3$ consecutive erroneous bits.

26 Claims, 2 Drawing Sheets

METHOD FOR TRANSMITTING A BINARY INFORMATION WORD

FIELD OF THE INVENTION

The invention relates generally to the transmission of binary information words, and, more particularly, to the detection of erroneous bits of these information words after the transmission.

BACKGROUND OF THE INVENTION

Conventionally, a CRC ("Cyclic Redundancy Check") code is used to detect erroneous bits in the information transmitted between two systems, namely a source system (emitter) and one or more receiving systems (receivers).

The emitter and the receivers are coupled by transmission circuitry that is usually not very reliable, which may disrupt the content of the information transmitted. For example, an information word being written in the form of a bit sequence "100011011" may, on reception, become "001011011". The values of the first and third bits have been corrupted during transmission.

For the receivers to detect that the received information word is incorrect, a few bits called the "signature" are added to the information word. This signature is obtained by applying a hash function to the information word to be transmitted, such as:

$$H(MI)=CRC$$

Where H is the hash function, MI is an information word to be transmitted, and CRC is its signature. This hash function is commonly called "Checksum" by those skilled in the art.

There are many functions capable of generating the signature (like the add function). Such a checksum function is considered to be effective if the signature systematically indicates the appearance of an erroneous bit.

An example checksum function is called Euclidian division. More precisely, the signature, also called "redundancy", is generated by dividing the information word to be transmitted by a generator polynomial. The redundancy is then equal to the rest of this Euclidian division.

It is considered that a generator polynomial supplies an effective redundancy if the latter allows the detection of a maximum of erroneous bits in the received information word. The qualification of a good generator polynomial then depends on the types of the most frequent errors associated with the transmission circuitry. Mainly, there are two types of errors, namely independent random errors (according to the Bernouilli scheme) and burst errors, in other words a certain number of consecutive erroneous bits.

It is particularly difficult to find a generator polynomial capable of generating a redundancy allowing the detection of these errors, whether they be random or burst.

SUMMARY OF THE INVENTION

According to a first aspect, a method is for transmitting a binary information word coded on r bits to which is attached a redundancy coded on s bits, s and r being integers. The redundancy signals the appearance of erroneous bits after the transmission, and is obtained by carrying out a Euclidian division of the information word to be transmitted by a generator polynomial coded on at most s bits.

According to a general feature of this aspect, the generator polynomial is chosen so that it satisfies at least one of the following conditions, namely that the Hamming weight of the multiples of the generator polynomial is greater than or equal to a chosen threshold, or the generator polynomial allows the detection of at least $2^{s-1}-3$ consecutive erroneous bits.

In other words, in order to generate an optimal redundancy, the generator polynomial may satisfy at least one of the two rules defined above and, preferably, both rules simultaneously.

A generator polynomial obeying the first of the rules (Hamming weight) makes it possible to generate a redundancy signaling at best the random errors. A generator polynomial obeying the second rule (detection of at least $2^{s-1}-3$ consecutive erroneous bits) makes it possible to generate a redundancy signaling at best the burst errors. The parameters used in each of the aforementioned rules are adjusted according to the chosen application (environment, type of receivers, etc.).

According to one embodiment, the generator polynomial is preferably coded on eight bits. In this case, the threshold is, for example, greater than or equal to 4. Still in the situation in which the generator polynomial is coded on eight bits, the latter preferably allows the detection of at least 125 consecutive erroneous bits.

As a variant, the threshold may be greater than or equal to 3. In this case, the generator polynomial may allow the detection of at least 126 consecutive erroneous bits.

According to one embodiment, the choice of a generator polynomial may include for each polynomial belonging to a chosen set, performing a first test in which the user verifies in parallel whether the polynomial allows the detection of a first number of consecutive erroneous bits equal to 126 on the one hand, and of a second number of consecutive erroneous bits equal to 125 on the other hand. In addition, for the polynomials verifying the first test relative to the first and to the second number of erroneous bits, a second test may be performed in which the user verifies whether these polynomials allow the detection of a number of consecutive erroneous bits either less than 126 if the polynomial already allows the detection of 126 consecutive erroneous bits, or less than 125 erroneous bits if the polynomial already allows the detection of 125 consecutive erroneous bits.

For the polynomials not satisfying the second test, a third test may be performed in which the user verifies whether the Hamming weight of the multiples of these polynomials is greater than or equal to 4. A classification of the polynomials satisfying the third test in a first family of generator polynomials may be generated. For the polynomials not satisfying the third test, a fourth test may be performed in which the user verifies whether the Hamming weight of the multiples of these polynomials is greater than or equal to three. A classification of the polynomials satisfying the fourth test in a second family of generator polynomials may be generated.

For example, a generator polynomial belonging to the first family may take the form $x^7+x^4+x^2+1$. A generator polynomial belonging to the second family may be chosen from $x^7+x^6+x^3+x+1$, $x^7+x^6+x^4+x+1$, $x^7+x+1$ or $x^7+x^6+x^5+x^3+x$.

According to another aspect, there is a system for transmitting a binary information word comprising an emitter and at least one receiver coupled via transmission circuitry, the system being capable of applying the method as defined above.

BRIEF DESCRIPTION OF THE DRAWINGS

Other advantages and features of the various aspects will appear on examining the detailed description of non-limiting examples and of the figures including.

DETAILED DESCRIPTION OF THE PREFERRED EMBODIMENTS

Figure 1:
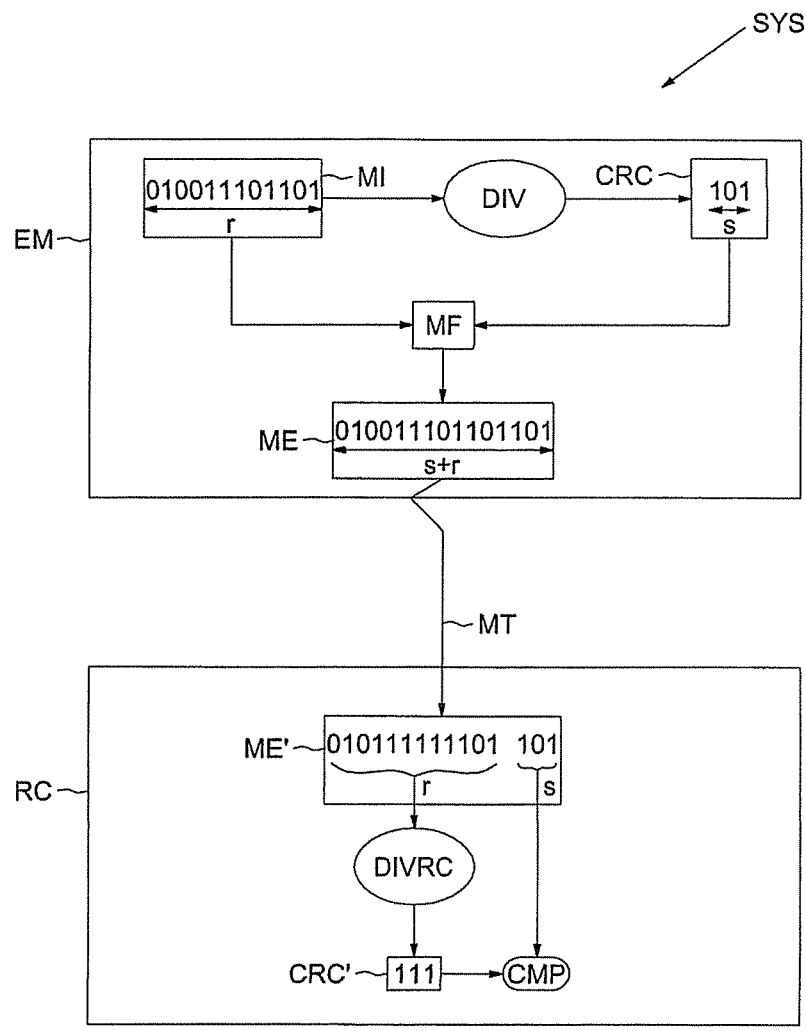
FIG. 1 illustrating a transmission system of the present invention.

In FIG. 1, the reference SYS illustrates a binary information word transmission system. This system SYS comprises an emitter EM and a receiver RC. This example is not limiting and the system SYS may comprise several receivers.

The emitter EM and the receiver RC are coupled via transmission circuitry MT. The emitter EM transmits to the receiver RC an information word MI coded on r bits (in this instance 12 bits), in this example the sequence "010011101101". Based on the information word MI, a redundancy CRC is generated. More precisely, the information word MI is transmitted to a divider DIV which carries out a Euclidian division of the information word MI by a generator polynomial, the features of which will be described in greater detail below.

The redundancy CRC is coded on s bits (s<r), in this example 3 bits "101". The redundancy CRC is the remainder of the Euclidian division of the information word MI by the generator polynomial.

Formation circuitry MF then forms the message to be transmitted ME based on the information word MI and the redundancy CRC. The redundancy is coupled to the information word MI. To do this, the formation circuitry MF may, for example, add s "0" at the end of the information word MI ("zero padding"). Then the formation circuitry MF adds up the information word MI then coded on r+s bits and the redundancy CRC.

The message to be transmitted ME is therefore a sequence of s+r bits, in this instance "010011101101101". The message received by the receiver is referenced ME'. It is also coded on r+s bits, the first r bits corresponding to the received information word and the last s bits corresponding to the redundancy.

The first r bits of the received message ME' are then divided by the same generator polynomial used to obtain the redundancy CRC within the emitter. This division is carried out by another divider DIVRC situated within the receiver RC. This then gives a value CRC' which is then compared with the last s bits of the message ME' with the aid of a comparator CMP.

If these last s bits (corresponding to the redundancy CRC) and the value CRC' are different (which is the case here because the fifth and eighth bits of the formation word received by the receiver RC are erroneous), the receiver is informed that the message ME' comprises erroneous bits.

The generator polynomial used by the dividers DIV and DIVRC is chosen so that the probability of having undetected errors during the transmission of a message is low. To do this, the generator polynomial obeys at least one of the two rules, namely that the Hamming weight of the multiples of the generator polynomial is greater than or equal to a chosen threshold, or the generator polynomial allows the detection of at least $2^{s-1}-3$ consecutive erroneous bits.

The calculation of the Hamming weight of the multiples of a polynomial should be understood by those skilled in the art. The aforementioned threshold corresponds to the minimal Hamming weight. This threshold is a function of the number of bits of the generator polynomial. Conventional tests make it possible to identify the acceptable thresholds for a given degree of polynomials.

Moreover, an optimal generator polynomial withstands at best $2^{s-1}-3$ consecutive errors if burst errors are considered, that is to say the number of consecutive bits of the information message having an erroneous value.

Figure 2:
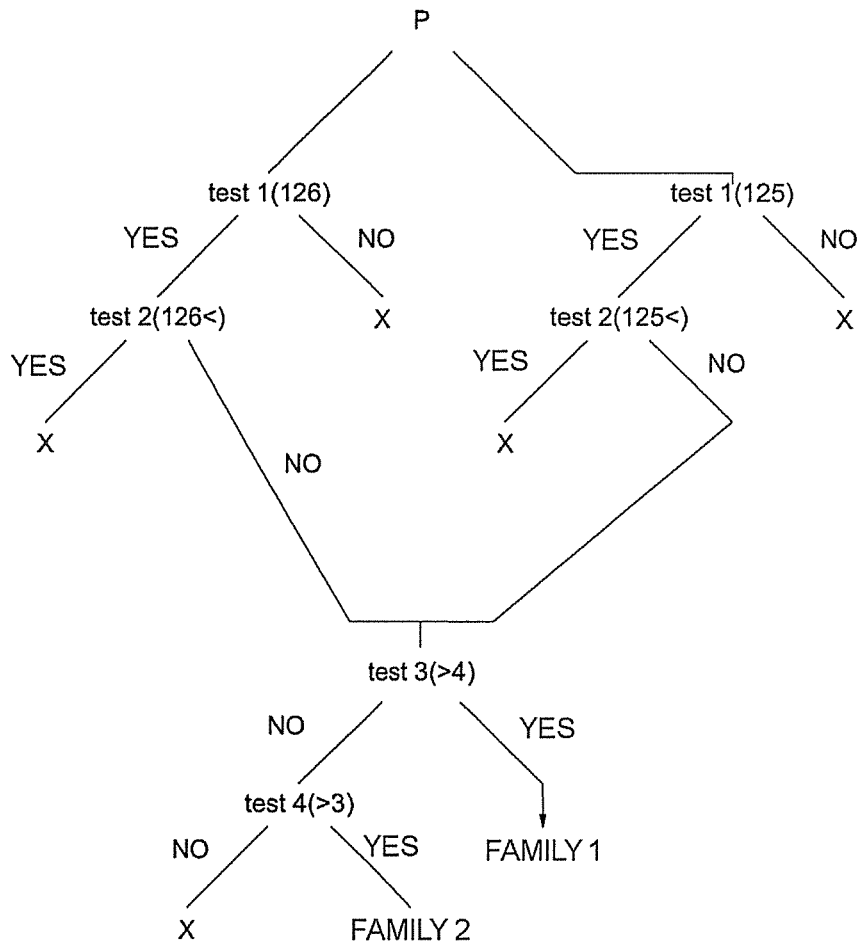
FIG. 2 illustrating as an example the choice of a generator polynomial coded on eight bits, according to the present invention.

FIG. 2 illustrates the various steps of the choice of an optimal generator polynomial. These steps are given for a generator polynomial coded on eight bits. The latter are particularly suitable for transmissions between wireless telecommunication systems (for example mobile telephones).

Let P be a polynomial that is tested in order to know if it corresponds to a good generator polynomial as defined above. A first test, test 1, is run which includes, notably, verifying whether the polynomial P allows the detection of at least 126 consecutive erroneous bits, that is to say $2^{s-1}-2$ consecutive erroneous bits, where s=8.

The same test is run on the polynomials P but, in this case, the user verifies what allows the detection of only 125 consecutive erroneous bits, that is to say $2^{s-1}-3$ consecutive erroneous bits, where s=8.

For the polynomials of which the test result is YES, a second test, test 2, is run to ascertain whether the polynomial allows the detection of less than 126 consecutive erroneous bits if test 1 relates to 126 bits, and of less than 125 consecutive erroneous bits if test 1 relates to 125 bits.

If the polynomial P in question verifies these second tests, it is not a candidate to be an optimal generator polynomial. In contrast, the polynomials not verifying this second test are then subjected to a third test, test 3, to ascertain whether the Hamming weight of the multiples of the latter is greater than or equal to 4.

If this is the case, the polynomials P are then classified in a first family, FAMILY 1. Otherwise, they are subjected to another test, test 4, in order to see whether the Hamming weight of the multiples of these polynomials is greater than or equal to 3. If this is the case, these polynomials are classified in a second family, FAMILY 2. Distributed in the table below are examples of polynomials belonging to FAMILY 1 or FAMILY 2 as defined above.

| Family 1 | Family 2 |
|---|---|
| $x^7 + x^5 + x^4 + x^2 + x + 1$ | $x^7 + x + 1$ |
| $x^7 + x^6 + x^5 + x^3 + x^2 + 1$ | $x^7 + x^6 + 1$ |
| $x^7 + x^5 + x + 1$ | $x^7 + x^3 + 1$ |
| $x^7 + x^6 + x^2 + 1$ | $x^7 + x^4 + 1$ |
| $x^7 + x^4 + x^2 + 1$ | $x^7 + x^5 + x^4 + x^3 + x^2 + x + 1$ |
| $x^7 + x^5 + x^3 + 1$ | $x^7 + x^6 + x^5 + x^4 + x^3 + x^2 + 1$ |
| | $x^7 + x^4 + x^3 + x^2 + 1$ |
| | $x^7 + x^5 + x^4 + x^3 + 1$ |
| | $x^7 + x^5 + x^2 + x + 1$ |
| | $x^7 + x^6 + x^5 + x^2 + 1$ |
| | $x^7 + x^6 + x^5 + x^3 + x^2 + x + 1$ |
| | $x^7 + x^6 + x^5 + x^4 + x^2 + x + 1$ |
| | $x^7 + x^3 + x^2 + x + 1$ |
| | $x^7 + x^6 + x^5 + x^4 + 1$ |
| | $x^7 + x^5 + x^3 + x + 1$ |
| | $x^7 + x^6 + x^4 + x^2 + 1$ |
| | $x^7 + x^6 + x^3 + x + 1$ |
| | $x^7 + x^6 + x^4 + x + 1$ |

The table above lists the generator polynomials coded on eight bits making it possible to have the best results, that is to say the lowest percentage of undetected errors.

The generator polynomials $x^7+x^6+x^3+x+1$ and $x^7+x^6+x^4+x+1$ are particularly effective for detecting potential random errors which may arrive on transmitters sensitive to electromagnetic interference. The polynomials $x^7+x+1$, $x^7+x^6+1$, $x^7+x^3+1$ and $x^7+x^4+1$ are, for their part, very effective when the circuit is short, that is to say when the distance between the emitter and the receiver is short.

That which is claimed is:

1. A method for transmitting a binary word comprising r bits and a cyclic redundancy check (CRC) comprising s bits, the method comprising:
   performing a Euclidian division of the binary word by a generator polynomial of at most s bits to thereby generate the CRC;
   the generator polynomial being such that a Hamming weight of multiples of the generator polynomial is at least at a threshold value; and
   transmitting the binary word and the CRC.

2. A method according to claim 1, wherein the generator polynomial comprises 8 bits.

3. A method according to claim 1, wherein the threshold value is at least 4.

4. A method according to claim 1, wherein the generator polynomial allows the detection of at least 125 consecutive errored bits.

5. A method according to claim 1, wherein the threshold value is at least 3.

6. A method according to claim 1, wherein the generator polynomial allows the detection of at least 126 consecutive errored bits.

7. A method according to claim 1, wherein the generator polynomial is selected by:
   for each polynomial belonging to a chosen set, performing a first test to verify whether the polynomial allows the detection of 126 consecutive errored bits, and whether the polynomial allows the detection of 125 consecutive errored bits;
   for each polynomial passing the first test, performing a second test to verify whether the polynomial allows the detection of less than 126 errored bits if the polynomial allows the detection of 126 consecutive errored bits, and whether the polynomial allows the detection of less than 125 errored bits if the polynomial allows the detection of 125 consecutive errored bits;
   for each polynomial failing the second test, performing a third test to verify whether the Hamming weight of the multiples of the polynomial is at least 4;
   classifying each polynomial passing the second test as belonging to a first family of generator polynomials;
   for each polynomial failing the third test, performing a fourth test to verify whether the Hamming weight of the multiples of the polynomial is at least 3;
   classifying each polynomial passing the third test as belonging to a second family of generator polynomials.

8. A method according to claim 7, wherein generator polynomials belonging to the first family of generator polynomials take a form of $x^7+x^4+x^2+1$.

9. A method according to claim 7, wherein polynomials belonging to the second family of generator polynomials take a form of one of $x^7+x^6+x^3+x+1$, $x^7+x^6+x^4x+1$, $x^7+x+1$, and $x^7+x^6+x^5+x^3+x$.

10. A method for transmitting a binary word comprising r bits and a cyclic redundancy check (CRC) comprising s bits, the method comprising:
    performing a Euclidian division of the binary word by a generator polynomial of at most s bits to thereby generate the CRC;
    the generator polynomial being such that the generator polynomial allows detection of at least $2^{s-1}-3$ consecutive errored bits, where $s \geq 3$; and
    transmitting the binary word and the CRC.

11. A method according to claim 10, wherein the generator polynomial is selected by:
    for each polynomial belonging to a chosen set, performing a first test to verify whether the polynomial allows the detection of 126 consecutive errored bits, and whether the polynomial allows the detection of 125 consecutive errored bits;
    for each polynomial passing the first test, performing a second test to verify whether the polynomial allows the detection of less than 126 errored bits if the polynomial allows the detection of 126 consecutive errored bits, and whether the polynomial allows the detection of less than 125 errored bits if the polynomial allows the detection of 125 consecutive errored bits;
    for each polynomial failing the second test, performing a third test to verify whether the Hamming weight of the multiples of the polynomial is at least 4;
    classifying each polynomial passing the second test as belonging to a first family of generator polynomials;
    for each polynomial failing the third test, performing a fourth test to verify whether the Hamming weight of the multiples of the polynomial is at least 3;
    classifying each polynomial passing the third test as belonging to a second family of generator polynomials.

12. A method according to claim 11, wherein generator polynomials belonging to the first family of generator polynomials take a form of $x^{7+x^4}+x^2+1$.

13. A method according to claim 11, wherein polynomials belonging to the second family of generator polynomials take a form of one of $x^7+x^6+x^3+x+1$, $x^7+x^6+x^4x+1$, $x^7+x+1$, and $x^7+x^6+x^5+x^3+x$.

14. A system for transmitting a binary word comprising r bits and a cyclic redundancy check (CRC) comprising s bits, the system comprising:
    CRC generation circuitry for
       performing a Euclidian division of the binary word by a generator polynomial of at most s bits to thereby generate the CRC,
       the generator polynomial being such that a Hamming weight of multiples of the generator polynomial is at least at a threshold value; and
    a transmitter to transmit the binary word and the CRC.

15. A system according to claim 14, wherein the generator polynomial comprises 8 bits.

16. A system according to claim 14, wherein the threshold value is least 4.

17. A system according to claim 14, wherein the generator polynomial allows the detection of at least 125 consecutive errored bits.

18. A system according to claim 14, wherein the threshold value is at least 3.

19. A system according to claim 14, wherein the generator polynomial allows the detection of at least 126 consecutive errored bits.

20. A system according to claim 14, wherein the CRC generation circuitry selects the generator polynomial by:

for each polynomial belonging to a chosen set, performing a first test to verify whether the polynomial allows the detection of 126 consecutive errored bits, and whether the polynomial allows the detection of 125 consecutive errored bits;

for each polynomial passing the first test, performing a second test to verify whether the polynomial allows the detection of less than 126 errored bits if the polynomial allows the detection of 126 consecutive errored bits, and whether the polynomial allows the detection of less than 125 errored bits if the polynomial allows the detection of 125 consecutive errored bits;

for each polynomial failing the second test, performing a third test to verify whether the Hamming weight of the multiples of the polynomial is at least 4;

classifying each polynomial passing the second test as belonging to a first family of generator polynomials;

for each polynomial failing the third test, performing a fourth test to verify whether the Hamming weight of the multiples of the polynomial is at least 3;

classifying each polynomial passing the third test as belonging to a second family of generator polynomials.

21. A system according to claim 20, wherein polynomials belonging to the first family of generator polynomials take a form of $x^7+x^4+x^2+1$.

22. A system according to claim 20, wherein polynomials belonging to the second family of generator polynomials take a form of one of $x^7+x^6+x^3+x+1$, $x^7+x^6+x^4x+1$, $x^7+x+1$, and $x^7+x^6+x^5+x^3+x$.

23. A system for transmitting a binary word comprising r bits and a cyclic redundancy check (CRC) comprising s bits, the system comprising:

CRC generation circuitry for
performing a Euclidian division of the binary word by a generator polynomial of at most s bits to thereby generate the CRC,
the generator polynomial being such that the generator polynomial allows detection of at least $2^{s-1}-3$ consecutive errored bits, where $s \geq 3$; and
a transmitter to transmit the binary word and the CRC.

24. A system according to claim 23, wherein the CRC generation circuitry selects the generator polynomial by:

for each polynomial belonging to a chosen set, performing a first test to verify whether the polynomial allows the detection of 126 consecutive errored bits, and whether the polynomial allows the detection of 125 consecutive errored bits;

for each polynomial passing the first test, performing a second test to verify whether the polynomial allows the detection of less than 126 errored bits if the polynomial allows the detection of 126 consecutive errored bits, and whether the polynomial allows the detection of less than 125 errored bits if the polynomial allows the detection of 125 consecutive errored bits;

for each polynomial failing the second test, performing a third test to verify whether the Hamming weight of the multiples of the polynomial is at least 4;

classifying each polynomial passing the second test as belonging to a first family of generator polynomials;

for each polynomial failing the third test, performing a fourth test to verify whether the Hamming weight of the multiples of the polynomial is at least 3;

classifying each polynomial passing the third test as belonging to a second family of generator polynomials.

25. A system according to claim 24, wherein polynomials belonging to the first family of generator polynomials take a form of $x^7+x^4+x^2+1$.

26. A system according to claim 24, wherein polynomials belonging to the second family of generator polynomials take a form of one of $x^7+x^6+x^3+x+1$, $x^7+x^6+x^4x+1$, $x^7+x+1$, and $x^7+x^6+x^5+x^3+x$.

* * * * *

UNITED STATES PATENT AND TRADEMARK OFFICE
CERTIFICATE OF CORRECTION

PATENT NO. : 8,572,468 B2  
APPLICATION NO. : 12/754845  
DATED : October 29, 2013  
INVENTOR(S) : Furodet Page 1 of 1

It is certified that error appears in the above-identified patent and that said Letters Patent is hereby corrected as shown below:

In the Claims:

Column 5, Line 66  
Delete: "$x^7+x^6+x^4x+1$"  
Insert: -- $x^7+x^6+x^4+x+1$ --

Column 6, Line 38  
Delete: "$x^{7+x4}+x^2+1$"  
Insert: -- $x^7+x^4+x^2+1$ --

Column 6, Line 41  
Delete: "$x^7+x^6+x^4x+1$"  
Insert: -- $x^7+x^6+x^4+x+1$ --

Column 7, Line 28  
Delete: "$x^7+x^6+x^4x+1$"  
Insert: -- $x^7+x^6+x^4+x+1$ --

Column 8, Line 34  
Delete: "$x^7+x^6+x^4x+1$"  
Insert: -- $x^7+x^6+x^4+x+1$ --

Signed and Sealed this  
Twenty-third Day of September, 2014

Michelle K. Lee  
*Deputy Director of the United States Patent and Trademark Office*